(12) United States Patent
Okamura et al.

(10) Patent No.: US 12,207,563 B2
(45) Date of Patent: Jan. 21, 2025

(54) MAGNETORESISTIVE DEVICES COMPRISING A SYNTHETIC ANTIFERROMAGNETIC COUPLING LAYER OF RuAl HAVING A (110) TEXTURE

(71) Applicant: Western Digital Technologies, Inc., San Jose, CA (US)

(72) Inventors: Susumu Okamura, San Jose, CA (US); James Mac Freitag, Sunnyvale, CA (US); Yuankai Zheng, Fremont, CA (US); Brian R. York, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 299 days.

(21) Appl. No.: 17/951,596

(22) Filed: Sep. 23, 2022

(65) Prior Publication Data
US 2024/0107893 A1    Mar. 28, 2024

(51) Int. Cl.
*H10N 50/10*   (2023.01)
*G01R 33/09*   (2006.01)
(Continued)

(52) U.S. Cl.
CPC .......... *H10N 50/10* (2023.02); *G01R 33/093* (2013.01); *G11B 5/3909* (2013.01);
(Continued)

(58) Field of Classification Search
CPC ...... H10N 50/10; H10N 50/85; G01R 33/093; G01R 33/098; G11B 5/3909; G11B 2005/3996; G11C 11/161; H01F 10/325; H01F 10/3272; H01F 10/1936; H01F 10/3254; H10B 61/00; G06K 7/082
See application file for complete search history.

(56) References Cited

U.S. PATENT DOCUMENTS 6,946,697 B2   9/2005  Pietambaram et al.
8,497,538 B2   7/2013  Pietambaram et al.
(Continued)

OTHER PUBLICATIONS

Filippou, Panagiotis Ch. et al., "Heusler-based synthetic antiferrimagnets", Science Advances, vol. 8, Issue 8, Feb. 2022, pp. 1-8, <https://www.science.org/doi/10.1126/sciadv.abg2469>.
(Continued)

*Primary Examiner* — Allison Bernstein
(74) *Attorney, Agent, or Firm* — PATTERSON + SHERIDAN, LLP

(57) ABSTRACT

The present disclosure generally relates to magnetoresistive (MR) devices. The MR device comprises a synthetic antiferromagnetic (SAF) layer that increases exchange coupling field, and in turn, less magnetic noise of such devices. The MR device comprises a first ferromagnetic (FM1) layer and a second ferromagnetic (FM2) layer, in between which is an SAF spacer of RuAl alloy having a B2 crystalline structure which may grow epitaxial on BCC (110) or FCC (111) textures, meaning that the (110) or (111) plane is parallel to the surface of MR device substrate. Further, amorphous layers may be inserted into the device structure to reset the growth texture of the device to a (001), (110), or (111) texture in order to promote the growth of tunneling barrier layers or antiferromagnetic (AF) pinning layers.

32 Claims, 8 Drawing Sheets

(51) Int. Cl.
*G11B 5/39* (2006.01)
*G11C 11/16* (2006.01)
*H01F 10/32* (2006.01)
*H10B 61/00* (2023.01)
*H10N 50/85* (2023.01)

(52) U.S. Cl.
CPC .......... *G11C 11/161* (2013.01); *H01F 10/325* (2013.01); *H01F 10/3272* (2013.01); *H10B 61/00* (2023.02); *H10N 50/85* (2023.02); *G11B 2005/3996* (2013.01)

(56) References Cited

U.S. PATENT DOCUMENTS

| 8,508,984 | B2 | | 8/2013 | Ranjan et al. | |
|---|---|---|---|---|---|
| 12,040,114 | B2 | * | 7/2024 | Okamura | ............ G11B 5/3909 |
| 2020/0259076 | A1 | | 8/2020 | Filippou et al. | |
| 2023/0084970 | A1 | * | 3/2023 | Okamura | ............... H10N 50/85 |
| | | | | | 257/421 |
| 2023/0225219 | A1 | * | 7/2023 | Kim | ....................... H10B 61/00 |
| | | | | | 365/158 |

OTHER PUBLICATIONS

Veloso, Anabela et al., "Spin valve sensors with synthetic free and pinned layers", Journal of Applied Physics, Jun. 2000, pp. 1-12, <https://www.researchgate.net/publication/224489681_Spin_valve_sensors_with_synthetic_free_and_pinned_layers>.

Lee, Du-Yeong et al., "Effect of coupling ability between a syntheticantiferromagnetic layer and pinned layer on abridging layer of Ta, Ti, and Pt in perpendicular-magnetic tunnel junctions", Nanotechnology, vol. 27, No. 29, Jun. 2016, <https://pubmed.ncbi.nlm.nih.gov/27292593/>.

\* cited by examiner

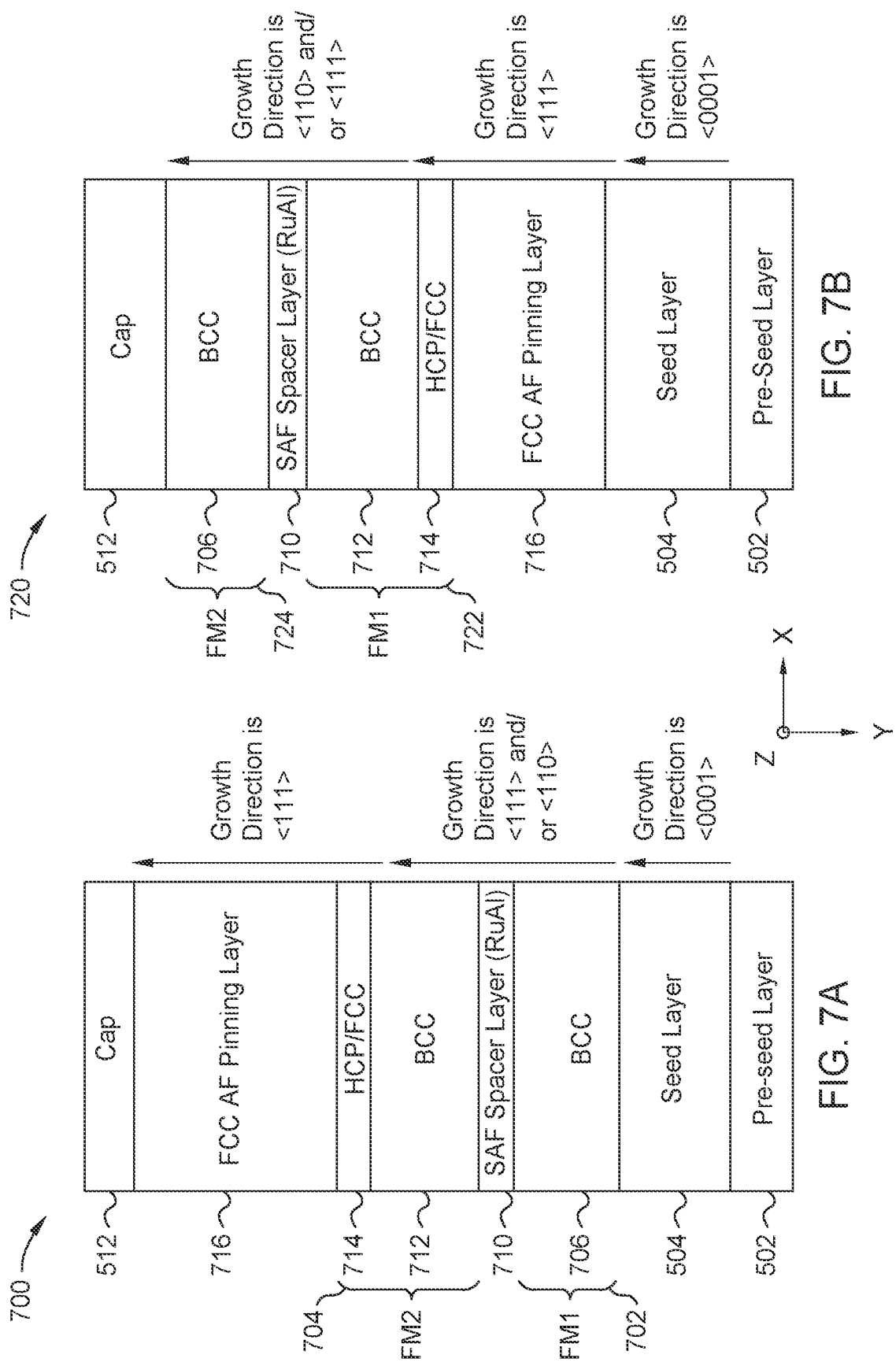

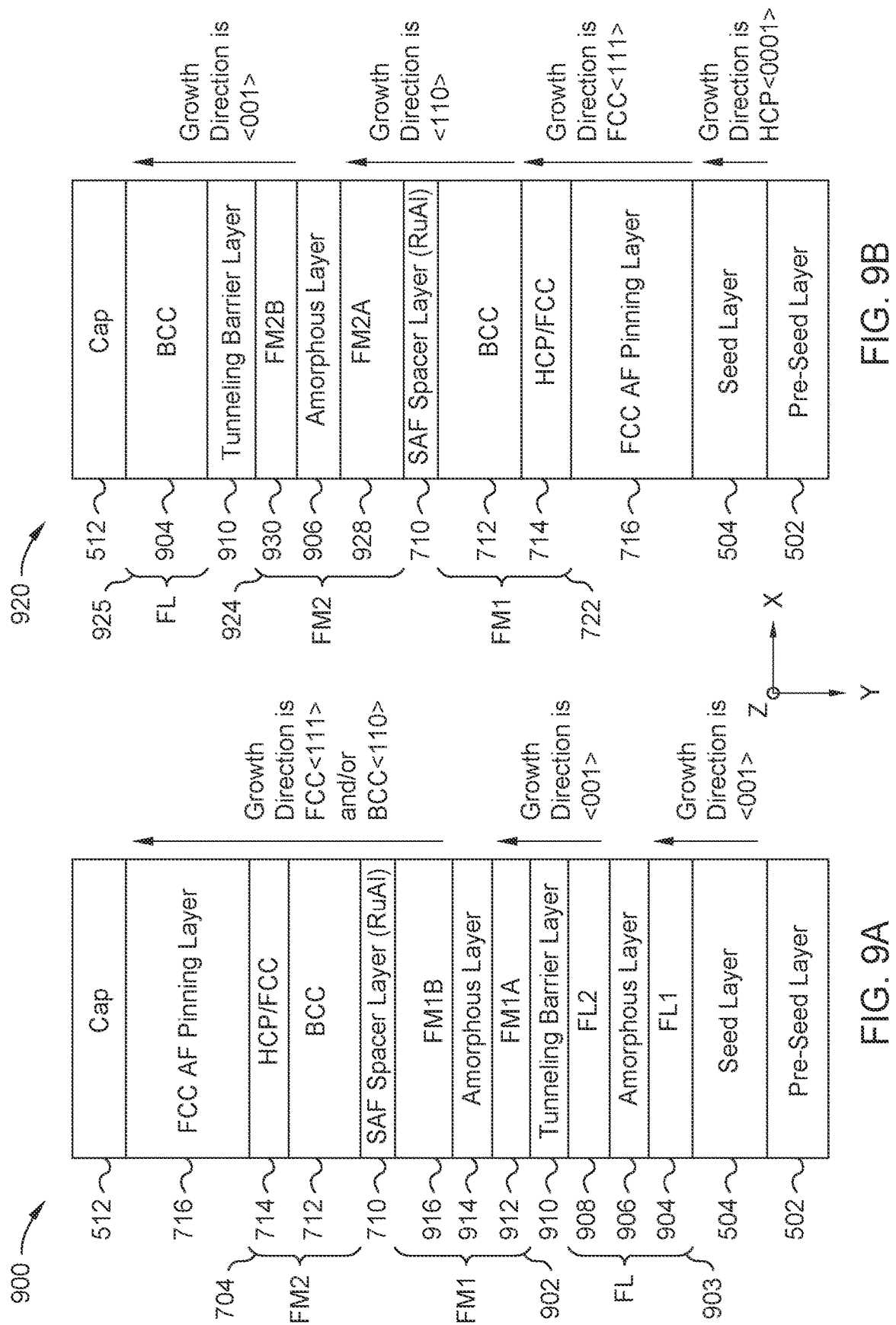

MAGNETORESISTIVE DEVICES COMPRISING A SYNTHETIC ANTIFERROMAGNETIC COUPLING LAYER OF RuAl HAVING A (110) TEXTURE

BACKGROUND OF THE DISCLOSURE

Field of the Disclosure

Embodiments of the present disclosure generally relate to magnetoresistive (MR) devices.

Description of the Related Art

Magnetoresistive (MR) devices are utilized in various ways in hard disk drives and memories, such as in magnetic recording heads, magnetic sensors, and magnetoresistive random access memory (MRAM) devices. MR devices generally comprise thin layers of magnetic and nonmagnetic metallic materials and insulating material in a spin-engineered stack, and the stacks may be based on giant magnetoresistive (GMR) effects and/or tunneling magnetoresistive (TMR) effects, for example. One challenge in building these stacks is to reduce, or more preferably eliminate, the magnetic dipole fields produced from the magnetic layers, with keeping high tolerance against temperature and magnetic fields.

Synthetic antiferromagnetic materials (SAFs) are used to address these challenges. SAFs are typically used in MR devices to control the magnetic state of the pinned layer. Generally, an overall SAF structures (also referred herein as SAF layer) includes antiferromagnetic coupled layers, where two ferromagnetic layers are separated by a transition metal spacer layer. SAF structures have a reduced net magnetic moment. As a result, structures with SAFs have the benefit of producing a weak dipole magnetic fields to other ferromagnetic layers. A SAF structure with stronger exchange coupling is desirable for overall MR device performance, but this conventionally involves tradeoffs in thermal and magnetic field stability. A thinner SAF spacer layer tends to produce stronger exchange coupling which in turn results in lower magnetic noise of the device. However, a thin SAF spacer layer simultaneously reduces the reliability of such devices. Some well-known materials for the SAF spacer layer such as Ru, Ir, and Cr tend to give stronger exchange coupling on close packed planes (e.g. HCP:0001, FCC:111, or BCC:110 textures) relative to other textures such as FCC/BCC:001 textures. A Ru SAF spacer layer has the highest SAF coupling field but the temperature stability is a relatively low. A thin Ru SAF spacer layer starts to diffuse at higher temperature and the coupling strength starts to degrade.

Therefore, there is a need in the art for better SAF spacer material to produce additional thermal stability and strong exchange coupling when used in a SAF structure with a growth of close packed planes within a MR device.

SUMMARY OF THE DISCLOSURE

The present disclosure generally relates to magnetoresistive (MR) devices. The MR device comprises a synthetic antiferromagnetic (SAF) layer that increases exchange coupling field, and in turn, less magnetic noise of such devices. The MR device comprises a first ferromagnetic (FM1) layer and a second ferromagnetic (FM2) layer, in between which is an SAF spacer of RuAl alloy having a B2 crystalline structure which may grow epitaxial on BCC (110) or FCC (111) textures, meaning that the (110) or (111) plane is parallel to the surface of MR device substrate. Further, amorphous layers may be inserted into the device structure to reset the growth texture of the device to a (001), (110), or (111) texture in order to promote the growth of tunneling barrier layers or antiferromagnetic (AF) pinning layers.

In one embodiment, a magnetoresistive (MR) device comprises a seed layer comprising Ru, a first ferromagnetic (FM1) layer disposed over the seed layer; a synthetic antiferromagnetic (SAF) spacer layer disposed on the FM1 layer, wherein the SAF spacer layer comprises RuAl, the SAF spacer layer has a (110) texture, and the SAF spacer layer having a total thickness in the range of about 6.5 Å to about 10 Å, and a second ferromagnetic (FM2) layer disposed on the SAF spacer layer.

In another embodiment, a giant magnetoresistive (GMR) device, comprising a seed layer grown with close-packed planes, a first ferromagnetic (FM1) layer disposed over the seed layer, the FM1 layer comprising a first BCC-based sublayer; a synthetic antiferromagnetic (SAF) spacer layer disposed on the FM1 layer, the SAF spacer layer comprising RuAl; a second ferromagnetic (FM2) layer disposed on the SAF spacer layer, the FM2 layer comprising a second BCC-based sublayer; a cap layer disposed over the FM2 layer; a free layer disposed between the seed layer and the cap layer; and a FCC antiferromagnetic pinning layer disposed between the seed layer and the cap layer.

In another embodiment, a tunneling magnetoresistive (TMR) device comprises a seed layer grown with close-packed planes; a first ferromagnetic (FM1) layer disposed over the seed layer; a synthetic antiferromagnetic (SAF) spacer layer disposed on the FM1 layer, wherein: the SAF spacer layer comprises RuAl, and the SAF spacer layer has a (110) texture; a second ferromagnetic (FM2) layer disposed on the SAF spacer layer; a cap layer disposed over the FM2 layer; and a pinning layer disposed between the seed layer and the cap layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7A is a schematic cross-sectional view of a top pinned structure with a 110-textured RuAl SAF structure, according to one embodiment.

FIG. 7B is a schematic cross-sectional view of a bottom pinned structure with a 110-textured RuAl SAF structure, according to another embodiment.

FIG. 9A is a schematic cross-sectional view of a top pinned tunneling magnetoresistive (TMR) device, according to one embodiment.

FIG. 9B is a schematic cross-sectional view of a bottom pinned TMR device, according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to magnetoresistive (MR) devices. The MR device comprises a synthetic antiferromagnetic (SAF) layer that increases exchange coupling field, and in turn, less magnetic noise of such devices. The MR device comprises a first ferromagnetic (FM1) layer and a second ferromagnetic (FM2) layer, in between which is an SAF spacer of RuAl alloy having a B2 crystalline structure which may grow epitaxial on BCC (110) or FCC (111) textures, meaning that the (110) or (111) plane is parallel to the surface of MR device substrate. Further, amorphous layers may be inserted into the device structure to reset the growth texture of the device to a (001), (110), or (111) texture in order to promote the growth of tunneling barrier layers or antiferromagnetic (AF) pinning layers.

The MR devices disclosed in various embodiments may be used in magnetic recording heads in magnetic recording devices such as hard disk drives and tape drives. The MR devices can also be used in magneto-resistive random access memory (MRAM) cells and magnetic sensors. Certain disclosed embodiments include such magnetic recording heads, magnetic recording devices, MRAM cells, and magnetic sensors incorporating the MR devices. For example, TMR devices in magnetic recording heads and MRAM cells are further described in co-owned U.S. patent application Ser. No. 17/472,019 filed Sep. 10, 2021, titled "Tunnel Magnetoresistive (TMR) Device with Improved Seed Layer," which is hereby incorporated by reference.

Figure 1:
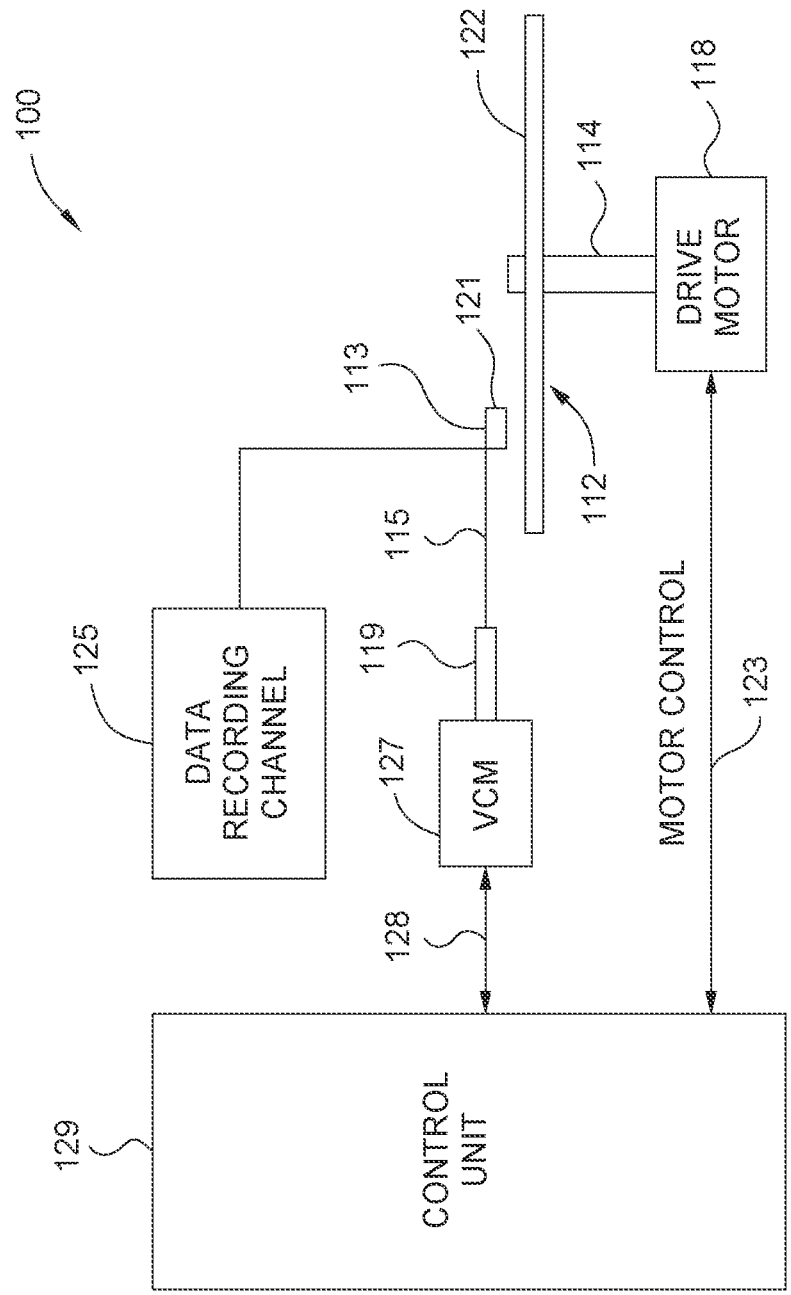
FIG. 1 illustrates a schematic illustration of a magnetic recording device, according to one embodiment.

FIG. 1 illustrates a disk drive 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the media surface 122 which exerts an upward force or lift on the slider 113. The air bearing thus counterbalances the slight spring force of suspension 115 and supports slider 113 off and slightly above the media 112 surface by a small, substantially constant spacing during normal operation. In the case of EAMR, a DC magnetic field generated from an assist element of the magnetic head assembly 121 enhances the write-ability so that the write element of the magnetic head assembly 121 may efficiently magnetize the data bits in the media 112.

The various components of the disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
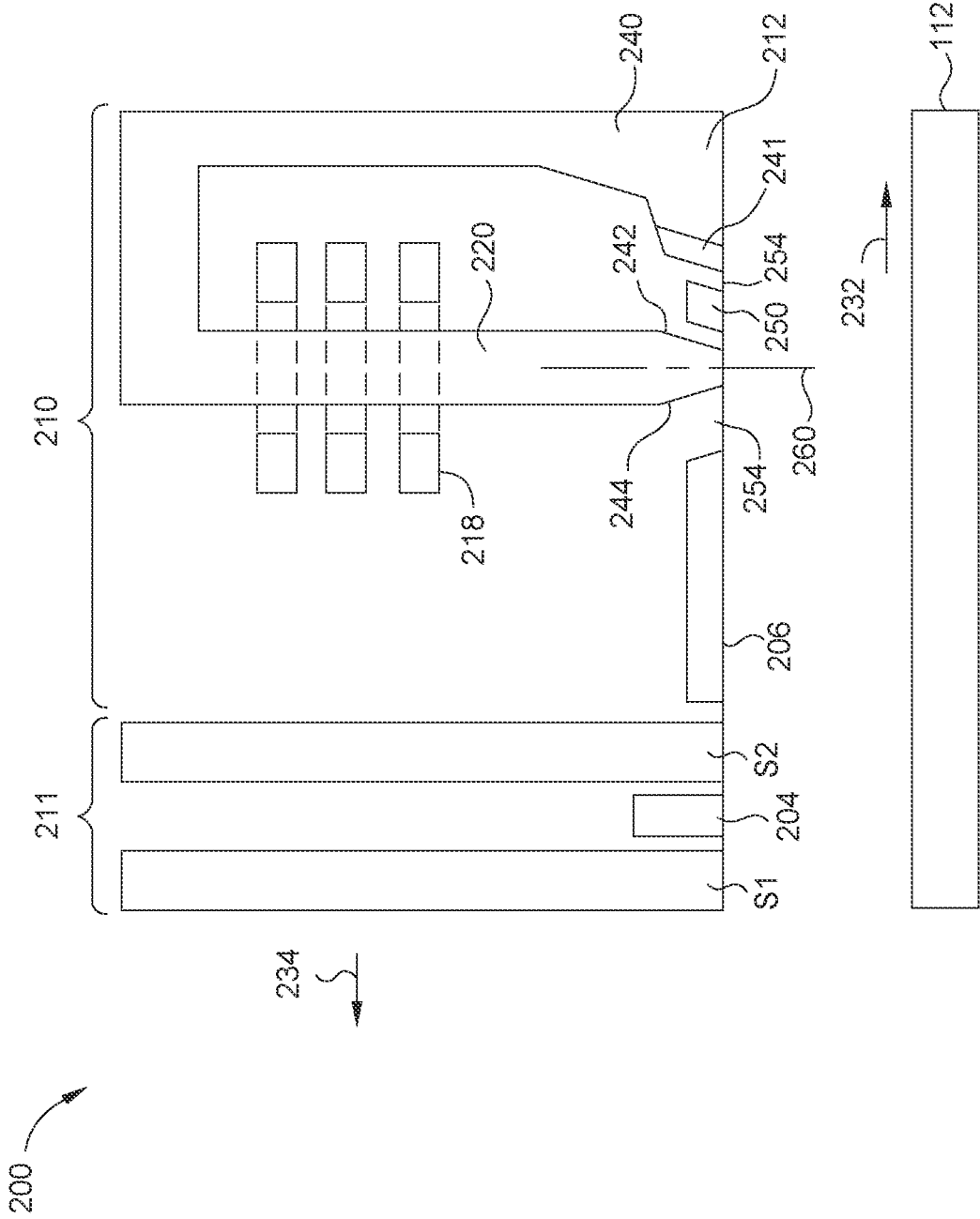
FIG. 2 is a fragmented, cross-sectional side view through the center of a read/write head facing a magnetic media, according to one embodiment.

FIG. 2 is a fragmented, cross sectional side view through the center of a read/write head 200 facing the magnetic media 112, according to one embodiment. The read/write head 200 may correspond to the magnetic head assembly 121 described in FIG. 1. The read/write head 200 includes a media facing surface (MFS) 212, such as an air bearing surface (ABS), a magnetic write head 210, and a magnetic read head 211, and is mounted such that the MFS 212 is facing the magnetic media 112. The read/write head 200 may be an energy-assisted magnetic recording (EAMR) head. In FIG. 2, the magnetic media 112 moves past the write head 210 in the direction indicated by the arrow 232 and the read/write head 200 moves in the direction indicated by the arrow 234.

In some embodiments, the magnetic read head 211 is a MR read head that includes an MR sensing element 204 (such as the various MR devices disclosed) located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap. A recording magnetic field is generated from the main pole 220 and the trailing shield 240 helps making the magnetic field gradient of the main pole 220 steep. The main pole 220 may be a magnetic material such as an FeCo alloy. The main pole 220 may include a trailing surface 222 which may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 T and a thickness of about 300 nanometers (nm). The main pole 220 may comprise ferromagnetic materials, typically alloys of one or more of Co, Fe and Ni. The trailing shield 240 may be a magnetic material such as NiFe alloy. In one embodiment, the trailing shield 240 has an Ms of about 1.2 T to about 1.6 T.

It is to be understood that the embodiments discussed herein are applicable to a data storage device such as a hard disk drive (HDD) as well as a tape drive such as a tape embedded drive (TED) or an insertable tape media drive such as an LTO drive. An example TED is described in co-pending patent application titled "Tape Embedded Drive," U.S. Pat. No. 10,991,390, issued Apr. 27, 2021, assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figures 3A, 3B:
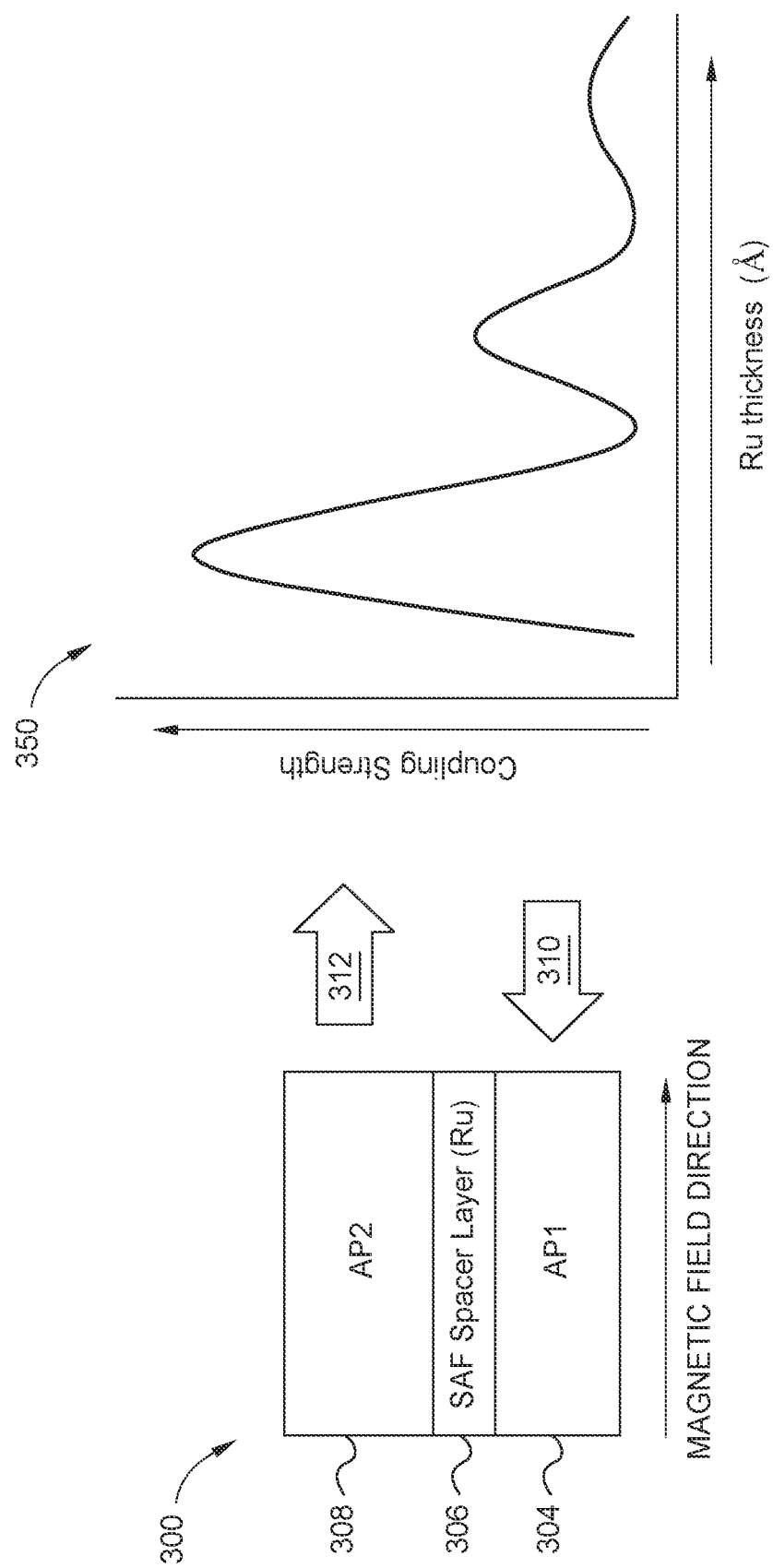
FIG. 3A is a cross-sectional view illustrating a conventional SAF layer.
FIG. 3B is a diagram illustrating the relationship between coupling strength and Ru thickness (Å) in conventional SAF layers (SAFs).

FIG. 3A is a schematic cross-sectional view of a conventional SAF layer (SAF) 300 having an antiparallel (AP) pinned structure comprising a first antiparallel coupled ferromagnetic (AP1) layer 304, a SAF spacer layer 306 disposed on the AP1 layer 304, and a second antiparallel coupled (AP2) layer 308 disposed on the SAF spacer layer 306. The AP1 layer 304 and AP2 layer 308 are antiferromagnetically coupled across the SAF spacer layer 306. The SAF spacer layer 306 comprises well-known materials such as Ru, Ir, Rh, or Cr, or alloys thereof. In this example, the SAF spacer layer 306 is a Ru alloy.

FIG. 3B is a diagram 350 illustrating the relationship between coupling strength and Ru thickness (Å) in an SAF structure of the SAF layers 300 of FIG. 3A. As shown in the diagram 350, the coupling strength of the SAF spacer layer 306 increases as the thickness of the SAF spacer layer 306 decreases. However, the reliability of the SAF spacer layer 306 decreases as the thickness of the SAF spacer layer 306 decreases. Thus, thinner SAF spacer layers 306 have less reliability and less stability. While thicker SAF spacer layers 306 are more robust and stable, thicker SAF spacer layers 306 have a reduced coupling strength. As such, there is a tradeoff between coupling strength and reliability with a SAF spacer layer 306.

RuAl is an intermetallic compound that forms a B2 crystalline structure. RuAl SAF spacer layers give the strongest coupling strength at around 7 Å to about 10 Å, and much larger coupling strength than Ru SAF spacer at the same thickness range. FIG. 4A illustrates a 3-dimensional lattice of the RuAl compound in a B2 crystalline phase. This B2 crystalline structure is extremely stable, is easily obtained when deposited, and grows well on BCC (110) and FCC (111) textures; for at least these reasons, RuAl can be utilized as a SAF layer material in MR structures without the tradeoff between coupling strength and reliability.

Figure 4B:
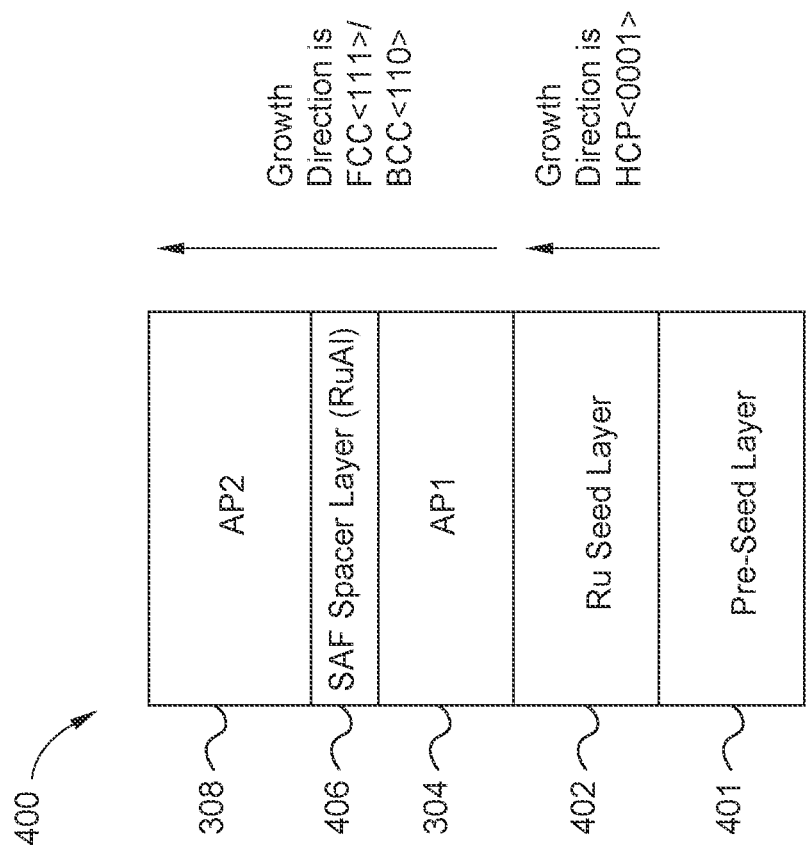
FIG. 4B is a schematic cross-sectional view illustrating a FCC 111/BCC 110-textured SAF layer, according to one embodiment.
Figure 4A:
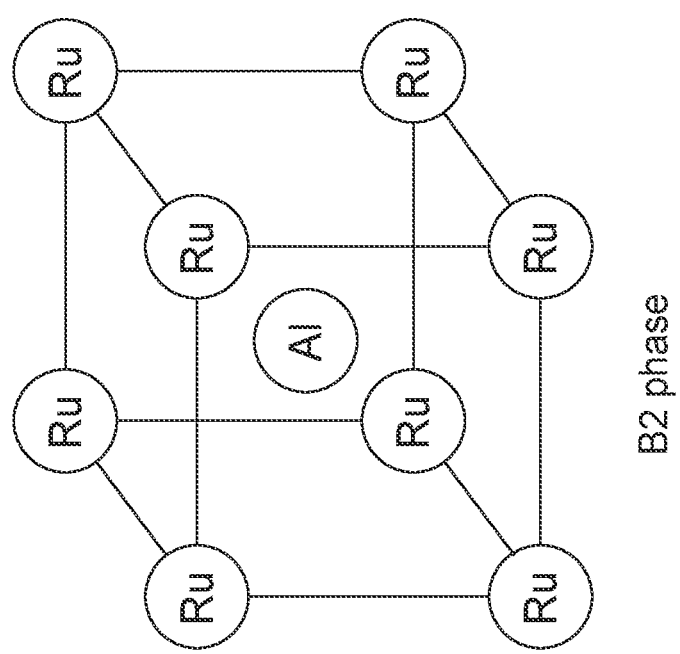
FIG. 4A is a schematic view of the B2 phase crystalline structure of RuAl.

FIG. 4B is schematic cross-sectional view of an SAF structure, according to an embodiment. The SAF structure of the SAF layers or SAFs 400 comprises a pre-seed layer 401, a seed layer 402 disposed on the pre-seed layer 401, the AP1 layer 304 disposed on the seed layer 402, a SAF spacer layer 406 disposed on the AP1 layer 304, and the AP2 layer 308 disposed on the SAF spacer layer 406. The SAF spacer layer 406 comprises RuAl and has a (110) texture and <110> growth direction. The SAF spacer layer 406 has a thickness of about 6.5 Å to about 10 Å. The pre-seed layer 401 comprises Ta, and is nano-crystalline or amorphous. The seed layer 402 comprises Ru or alloys thereof. The seed layer 402 has a close-packed plane texture, such as FCC (111), BCC (110), or HCP (0001), for example. In the some embodiments, Ru has a HCP structure, and thus, the seed layer 402 grows in a <0001> direction and has a (0001) texture.

More generally, the seed layer 402, the AP1 layer 304, the SAF spacer layer 406, and the AP2 layer 308 may comprise other suitable materials with a BCC, a HCP, or a FCC structure. A material with a BCC structure will grow in a <110> direction and have a (110) texture. A material with a FCC structure will grow in a <111> direction and have a (111) texture. The AP1 layer 304, SAF spacer layer 406, and AP2 layer 308 all grow epitaxial with a BCC (110) or FCC (111) texture, as indicated by the arrow.

Figures 5, 6:
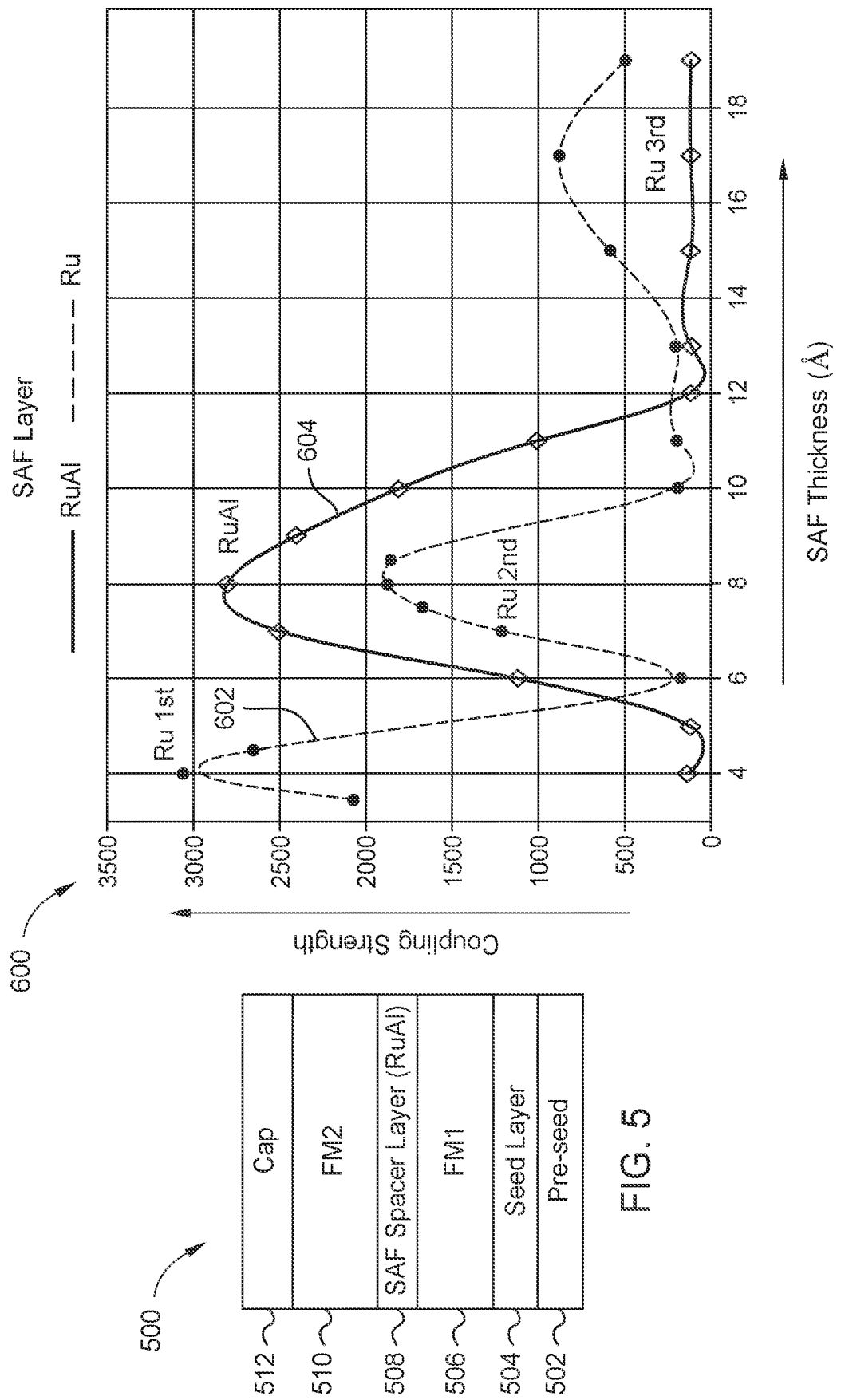
FIG. 5 is a schematic cross-sectional view of a layer stack with a 110-textured SAF spacer layer with a RuAl SAF layer, according to one embodiment.
FIG. 6 is a diagram comparing coupling strength relative to the thickness of a SAF spacer layer comprising Ru versus a SAF spacer layer comprising RuAl.

FIG. 5 is a schematic cross-sectional view of layer stack with a SAF layer having an improved SAF spacer layer and seed layer, according to one embodiment of the disclosure. Layer stack 500 may be utilized in a MR device according to various embodiments. The layer stack 500 may be utilized with the SAF structure 400 of FIG. 4B. The layer stack 500 comprises a pre-seed layer 502 disposed on a suitable substrate or shield (not shown), a seed layer 504 disposed on the pre-seed layer 502, a first pinned ferromagnetic (FM1) layer 506 disposed on the seed layer 504, the SAF spacer layer 508 comprising RuAl disposed on the FM1 layer 506, a second ferromagnetic (FM2) layer 510 disposed on the SAF spacer layer 508, and a cap layer 512 disposed on the FM2 layer 510. The SAF spacer layer 508 may be the SAF spacer layer 406 of FIG. 4B, the FM1 layer 506 may be the AP1 layer 304 of FIG. 4B, and the FM2 layer 510 may be the AP2 layer 308 of FIG. 4B. The FM1 layer 506 and FM2 layer 510 are antiferromagnetically coupled across the SAF spacer layer 508.

The electrically conductive amorphous pre-seed layer 502 may be a single layer or multilayer comprising one or more materials selected from the group consisting of a NiFeTa alloy, a CoFeTa alloy, a CoFeB alloy, a CoFeBTa alloy, and Ta, with a total thickness in the range of about 5 Å to about 50 Å, such as about 30 Å. The electrically conductive seed layer 504 comprises Ru or any materials having a texture of close-packed-plane, with a total thickness in the range of about 5 Å to about 50 Å, such as about 30 Å. The Ru seed layer 504 has growth direction of <0001> and a (0001) texture.

The SAF spacer layer 508 comprises RuAl. In the present embodiment, the total thickness of the SAF spacer layer 508 is in the range of about 6.5 Å to about 10 Å, such as about 8 Å. The SAF spacer layer 508 in such a thickness range shows strong AP coupling and is strongest at about 8 Å, as shown in FIG. 6. The non-magnetic cap layer 512 may be a Ru/Ta/Ru multilayer. The cap layer 512 protects the FM1 and FM2 layers 506, 510 from chemical and mechanical damages during processing, so that the FM1 and FM2 layers maintain strong ferromagnetic properties.

The FM 1 layer 506 and the FM2 layer 510 each individually comprises a suitable material with a BCC structure that grows in a <110> direction and forms a (110) texture, or with a FCC structure that grows in a <111> direction and forms a (111) texture. Suitable materials with BCC structures that can form a (110) texture include a CoFe alloy, a CoFeNi-based alloy, Heusler alloys such as $Co_2MnSi$, $Co_2MnAl$, $Co_2MnGe$, $Co_2FeSi$, and $Co_2FeAl$, and half-Heusler alloys such as NiMnSb, or more generally, Heusler alloys with B2 DO3, C1b, and L21 structures. Suitable materials with FCC structures that can form a (111) texture include Ni—Fe alloys. The FM1 layer 506 and the FM2 layer 510 each individually has a thickness in the range of about 10 Å to about 80 Å, such as about 30 Å, and can also be multilayered structures.

FIG. 6 is a diagram 600 comparing coupling strength relative to the thickness of the SAF spacer layers comprising Ru, such as the SAF spacer layer 300 of FIG. 3A, versus SAF spacer layers comprising RuAl, such as the SAF spacer layer 500 of FIG. 5. As shown in the diagram 600, at a similar thickness, the coupling strength of a RuAl SAF spacer layer is greater than that of a Ru SAF spacer layer. Moreover, RuAl SAF spacer layers provide strong coupling strength with thick SAF spacer layer thickness resulting in better reliability.

FIGS. 7A-9B illustrate various embodiments of pinned SAF structures and MR devices 700-920. As such, aspects of the MR devices 700-920 of FIGS. 7A-9B may be used in combination with one another. Moreover, one or more of the MR devices 700-920 of FIGS. 7A-9B may comprise the same layers or sublayers, which serve the same function or purpose within each device.

FIG. 7A is a schematic cross-sectional view of a top pinned structure 700 comprising a RuAl SAF spacer layer 710, according to one embodiment. The top pinned structure 700 comprises a suitable substrate or shield (not shown), the pre-seed layer 502 disposed on the substrate or shield, the seed layer 504 disposed on the pre-seed layer 502, a first ferromagnetic (FM1) layer 702 disposed on the seed layer 504, the SAF spacer layer 710 comprising RuAl disposed on the FM1 layer 702, a second ferromagnetic (FM2) layer 704 disposed on the SAF spacer layer 710, a antiferromagnetic (AF) pinning layer 716 disposed on the FM2 layer 704, and the cap layer 512 disposed on the AF layer 716. The SAF spacer layer 710 has a (110) texture and <110> growth direction, and has a thickness of about 6.5 Å to about 10 Å.

In the present embodiment, the FM1 layer 702 comprises a BCC layer 706. The BCC layer 706 comprises a BCC structured material, such as CoFe or an alloy thereof, and has a total thickness in the y-direction of about 25 to about 50 Å. The SAF spacer layer 710 comprises RuAl or an alloy thereof, and has a total thickness in the y-direction of about 8 Å. The composition of RuAl is $Ru_xAl_y$, where x and y are atomic percentages (y is equal to 100−x) and y is in a range of about 40 to 55, such as about 44.

The FM2 layer 704 is a multilayer structure comprising a BCC sublayer 712 disposed on the SAF spacer layer 710, and a HCP/FCC sublayer 714 disposed on the BCC sublayer 712. The BCC sublayer 712 comprises CoFe or an alloy thereof, with a total thickness in the y-direction of about 20 to about 50 Å. The HCP/FCC sublayer 714 comprises Co or an alloy thereof, and has a total thickness in the y-direction of about 3 to 10 Å. The FCC AF pinning layer 716 comprises IrMn or an alloy thereof, and has a total thickness in the y-direction of about 60 Å.

The FM1 layer 702 and the FM2 layer 704 each individually comprises a suitable material with a BCC structure that grows in a <110> direction and forms a (110) texture, or with a FCC structure that grows in a <111> direction and forms a (111) texture. Other suitable materials with BCC structures include a CoFe alloy, a CoFeNi-based alloy, Heusler alloys such as $Co_2MnSi$, $Co_2MnAl$, $Co_2MnGe$, $Co_2FeSi$, and $Co_2FeAl$, and half-Heusler alloys such as NiMnSb, or more generally, Heusler alloys with B2 DO3, C1b, and L21 structure. Suitable materials with FCC structures that can form a (111) texture include Ni—Fe alloy. As shown by the arrows, the seed layer 504 has a HCP (0001) texture and <0001> growth direction, the FM1 702, the SAF spacer layer 710, and the BCC sublayer 712 have a (110) texture and <110> growth direction, and the HCP/FCC sublayer 714 and the FCC AF pinning layer 716 have a (111) texture and <111> growth direction.

The FM1 702 may be a multilayer structure, where sublayers disposed adjacent to the seed layer 504 may be FCC or BCC, and sublayers disposed adjacent to the SAF spacer layer 710 are BCC. Similarly, the FM2 704 may be a multilayer structure, where sublayers disposed adjacent to the FCC AF pinning layer 716 may be FCC, HCP, or BCC, and sublayers disposed adjacent to the SAF spacer layer 710 are BCC.

FIG. 7B is a schematic cross-sectional view of a bottom pinned structure 720 comprising a RuAl SAF spacer layer, according to another embodiment. The bottom pinned structure 720 comprises a substrate or shield (not shown), the pre-seed layer 502 disposed on the substrate or shield, the seed layer 504 disposed on the pre-seed layer 502, a antiferromagnetic (AF) pinning layer 716 on the seed layer 504, a FM1 layer 722 disposed on the AF layer 716, the SAF spacer layer 710 comprising RuAl disposed on the FM1 layer 722, a FM2 layer 724 disposed on the SAF spacer layer 710, and the cap layer 512 disposed on the FM2 layer 762. The SAF spacer layer 710 has a (110) texture and <110> growth direction, and has a thickness of about 6.5 Å to about 10 Å.

In the present embodiment, the FM1 layer 722 comprises the HCP/FCC sublayer 714 disposed on the FCC AF pinning layer 716, and the BCC sublayer 712. The FM2 layer 724 comprises the BCC layer 706.

The FM1 layer 722 and the FM2 layer 724 each individually comprises a suitable material with a BCC structure that grows in a <110> direction and forms a (110) texture, and/or with a FCC structure that grows in a <111> direction and forms a (111) texture, as indicated by the arrows. Suitable materials with BCC structures include a CoFe alloy, a CoFeNi-based alloy, Heusler alloys such as Co$_2$MnSi, Co$_2$MnAl, Co$_2$MnGe, Co$_2$FeSi, and Co$_2$FeAl, and half-Heusler alloys such as NiMnSb, or more generally, Heusler alloys with B2 DO3, C1b, and L21 structure. As shown by the arrows, the seed layer 504 has a HCP(0001) texture and <0001> growth direction, the HCP/FCC sublayer 714 and the FCC AF pinning layer 716 have a (111) texture and <111> growth direction, and the FM2 724, the SAF spacer layer 710, and the BCC sublayer 712 have a (110) texture and <110> growth direction.

The FM1 722 may be a multilayer structure, where sublayers disposed adjacent to FCC AF pinning layer 716 may be FCC or BCC, and sublayers disposed adjacent to the SAF spacer layer 710 are BCC. Similarly, the FM2 704 may be a multilayer structure, where sublayers disposed adjacent to the cap layer 512 may be FCC, HCP, or BCC, and sublayers disposed adjacent to the SAF spacer layer 710 are BCC.

Figures 8A, 8B:
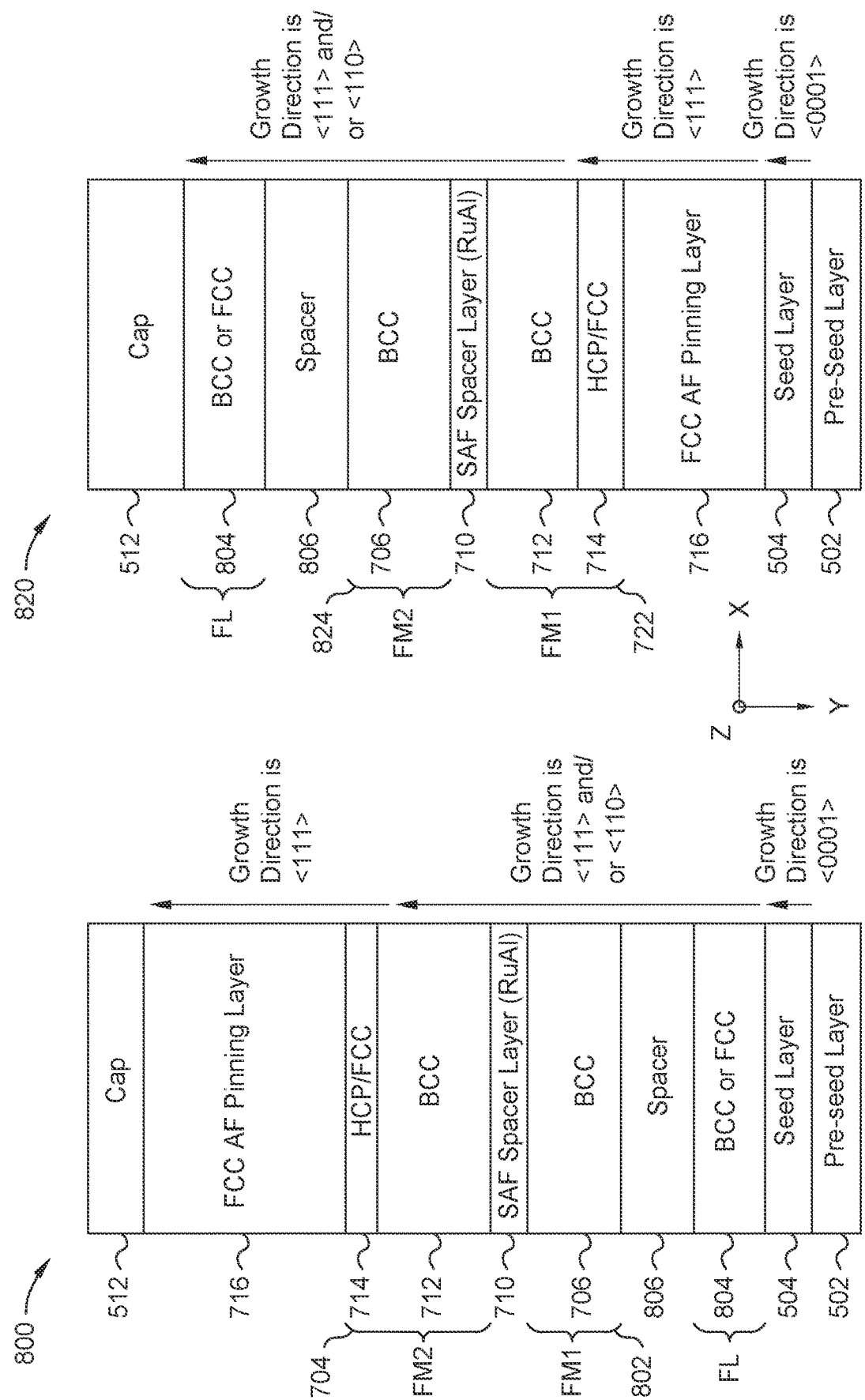
FIG. 8A is a schematic cross-sectional view of a top pinned giant magnetoresistive (GMR) device, according to yet one embodiment.
FIG. 8B is a schematic cross-sectional view of a bottom pinned GMR device, according to another embodiment.

FIG. 8A is a schematic cross-sectional view of a top pinned GMR device 800, according to one embodiment. The top pinned GMR device 800 comprises a suitable substrate or shield (not shown), the pre-seed layer 502 disposed on the substrate, the seed layer 504 disposed on the pre-seed layer 502, a ferromagnetic free layer (FL) 804 disposed on the seed layer 504, a GMR spacer layer 806 disposed on a FL 804, a FM1 layer 802 disposed on the GMR spacer layer 806, the SAF spacer layer 710 comprising RuAl disposed on the FM1 layer 802, the FM2 layer 704 disposed on the SAF spacer layer 710, a FCC antiferromagnetic (AF) pinning layer 716 disposed on the FM2 layer 704, and the cap layer 512 disposed on the FCC AF pinning layer 716. The SAF spacer layer 710 has a (110) texture and <110> growth direction, and has a thickness of about 6.5 Å to about 10 Å.

The FM1 layer 802 comprises a ferromagnetic BCC layer 706 disposed on the GMR spacer layer 806. The GMR spacer layer 806 comprises a Cu and/or an Ag based material. The ferromagnetic free layer 804 is free to rotate in a plane parallel to the surfaces of the seed layer 504 and the substrate or shield (not shown) in response to transverse external magnetic fields, such as from a recording disk or other recorded magnetic media, or from other sources when used as a magnetic sensor. The ferromagnetic free layer 804 comprises a suitable ferromagnetic, BCC and/or FCC material(s), and can be composed of multiple magnetic sublayers. The FM2 layer 704 is a multilayer structure comprising a BCC sublayer 712 disposed on the SAF spacer layer 710 and a HCP/FCC sublayer 714 disposed on the BCC sublayer 712. As shown by the arrows, the seed layer 504 has a HCP (0001) texture and <0001> growth direction, the free layer 804 and the spacer layer 806 have a FCC (111) with a <111> growth direction and/or BCC (110) texture with a <110> growth direction, the BCC layer 706, the SAF spacer layer 710, and the BCC sublayer 712 have a (110) texture and <110> growth direction, and the HCP/FCC sublayer 714 and the FCC AF pinning layer 716 have a (111) texture and <111> growth direction.

The FM1 802 may be a multilayer structure, where sublayers disposed adjacent to spacer layer 806 may be FCC or BCC, and sublayers disposed adjacent to the SAF spacer layer 710 are BCC. Similarly, the FM2 704 may be a multilayer structure, where sublayers disposed adjacent to the FCC AF pinning layer 716 may be FCC, HCP, or BCC, and sublayers disposed adjacent to the SAF spacer layer 710 are BCC.

Since the ferromagnetic free layer 804 is free to rotate in response to transverse external magnetic fields, when a sense current flows through the stack (in a y direction), the magnetization rotation of the ferromagnetic free layer 804 will lead to the variation of the angle between the magnetizations of the FM1 layer 802 and the ferromagnetic free layer 804, which is detectable as the change in electrical resistance. The GMR device 800 may be a current in plane (CIP) or a current perpendicular to plane (CPP) GMR device.

FIG. 8B is a schematic cross-sectional view of a bottom pinned GMR device 820, according to another embodiment. The bottom pinned GMR device 820 comprises a suitable substrate or shield (not shown), a pre-seed layer 502 disposed on the substrate, a seed layer 504 disposed on the pre-seed layer 502, a FCC antiferromagnetic (AF) pinning layer 716 disposed on the seed layer 504, a FM1 layer 722 disposed on the AF pinning layer 716, a SAF spacer layer 710 comprising RuAl disposed on the FM1 layer 722, a FM2 layer 824 disposed on the SAF spacer layer 710, a GMR spacer layer 806 disposed on the FM2 layer 824, a ferromagnetic free layer 804 disposed on the GMR spacer layer 806, and the cap layer 512 disposed on the ferromagnetic free layer 804. The SAF spacer layer 710 has a (110) texture and <110> growth direction, and has a thickness of about 6.5 Å to about 10 Å.

The FM1 layer 722 comprises the HCP/FCC sublayer 714 disposed on the FCC AF pinning layer 716, and the BCC sublayer 712. The FM2 layer 824 comprises the BCC layer 706 disposed on the SAF spacer layer 710. As shown by the arrows, the seed layer 504 has a HCP (0001) texture and <0001> growth direction, the HCP/FCC sublayer 714 and the FCC AF pinning layer 716 have a (111) texture and <111> growth direction, and the BCC sublayer 712, the SAF spacer layer 710 and the BCC layer 706 have a (110) texture, the spacer sublayer 806, and the free layer 804 have a FCC (111) and/or BCC (110) texture and FCC<111> and/or BCC<110> growth direction.

The FM1 722 may be a multilayer structure, where sublayers disposed adjacent to FCC AF pinning layer 716 may be FCC, HCP, or BCC, and sublayers disposed adjacent to the SAF spacer layer 710 are BCC. Similarly, the FM2 824 may be a multilayer structure, where sublayers disposed adjacent to the spacer layer 806 may be FCC or BCC, and sublayers disposed adjacent to the SAF spacer layer 710 are BCC.

FIG. 9A is a schematic cross-sectional view of a top pinned tunneling magnetoresistive (TMR) device 900, according to one embodiment. In a pinned-type TMR device, a SAF layer consisting of FM1 and FM2 has its magnetization fixed or pinned while another ferromagnetic free layer (FL) has its magnetization free to rotate in the presence of an external magnetic field. The pinned ferromagnetic layer is called the reference layer because its magnetization is prevented from rotation. The magnetization of the reference layer can be fixed or pinned by being formed of a high-coercivity film or by being exchange-coupled to an AF pinning layer. The pinned-type TMR device can be used as memory cells in an MRAM device. The orientation of the magnetization of the free ferromagnetic layer can be modified using an external field to have an orientation either parallel or antiparallel to the fixed magnetization of the reference, thereby generating two resistance levels representing a 1 (parallel) or 0 (antiparallel) as a bit.

The top pinned TMR device 900 comprises a suitable substrate or shield (not shown), the pre-seed layer 502 disposed on the substrate, the seed layer 504 disposed on the pre-seed layer 502, a ferromagnetic free layer (FL) 903 disposed on the seed layer 504, a tunneling barrier layer 910 disposed on the FL 903, a FM1 layer 902 disposed on the tunneling barrier layer, a SAF spacer layer 710 comprising RuAl disposed on the FM1 layer 902, a FM2 layer 704 disposed on the SAF spacer layer 710, a FCC antiferromagnetic pinning (AF) layer 716 disposed on the FM2 layer 704, and the cap layer 512 disposed on the AF pinning layer 716. The SAF spacer layer 710 has a (110) texture and <110> growth direction, and has a thickness of about 6.5 Å to about 10 Å.

The FL 903 comprises a first free sublayer 904 disposed on the seed layer 504, a first amorphous ferromagnetic sublayer 906 disposed on the first free sublayer 904, and a second free sublayer 908 disposed on the first amorphous ferromagnetic sublayer 906. The FM1 902 comprises a first ferromagnetic sublayer (FM1A) 912 disposed on the tunneling barrier layer 910, a second amorphous magnetic sublayer 914 disposed on the first ferromagnetic sublayer 912, and a second ferromagnetic sublayer 916 (FM1B) disposed on the second amorphous magnetic sublayer 914.

The FM2 layer 704 is a multilayer structure comprising a BCC ferromagnetic sublayer 712 disposed on the SAF spacer layer 710 and a HCP/FCC sublayer 714 disposed on the BCC sublayer 712. As shown by the arrows, the seed layer 504 and the first free layer 904 have a growth of close-packed planes. The first amorphous ferromagnetic layer 906 breaks the texture of FL1 such that the second free sublayer 908, the tunneling barrier layer 910, and the FM1A 912 have a (001) texture and <001> growth direction. The second amorphous magnetic sublayer 914 breaks the (001) texture and <001> growth direction such that the FM1B 916, the SAF spacer layer 710, and each sublayer of the FM2 704 have (110) texture and <110> growth direction or a (111) texture and a <111> growth direction. The FM2 704 may be a multilayer structure, where sublayers disposed adjacent to FCC AF pinning layer 716 may be FCC, HCP, or BCC, and sublayers disposed adjacent to the SAF spacer layer 710 are BCC.

The FL2 908 comprise a ferromagnetic, BCC structure material. The ferromagnetic free sublayers 904, 906, and 908 are magnetically coupled and are free to rotate all together in a plane parallel to the surfaces of the seed layer 504 and the substrate or shield (not shown) in response to transverse external magnetic fields from a recording disk or other external magnetic field from the recorded magnetic media. Since the free sublayers 904, 906, and 908 are free to rotate in response to transverse external magnetic fields, when a sense current flows through the stack (in a y direction), the magnetization rotation of the free sublayers 904, 906, and 908 will lead to the variation of the angle between the magnetizations of the FM1 layer 902 and the FL 903, which is detectable as the change in electrical resistance.

The tunneling barrier sublayer 910 comprises MgO, and grows epitaxial with the (001) texture of the second free sublayer 908, as indicated by the arrows. Other suitable materials may function as tunneling barriers and can inherit the (001) texture of the second free sublayer 908, such as ZnO, MnO, CoO, TiO, and VO, as well as spinel materials such as $MgAl_2O_4$ and $MgGa_2O_4$. The first ferromagnetic sublayer 912 and second ferromagnetic sublayer 916 each individually comprises at least one BCC-based material, such as CoFe or an alloy thereof at closer interface to tunneling barrier layer and SAF spacer layer.

The amorphous sublayers 906 and 914 comprise CoFeBTa or an alloy thereof and are inserted into the stack to promote the growth of the tunneling barrier layer 910 and the FCC AF pinning layer 716, respectively. For instance, MgO tunnel junctions of the tunneling barrier sublayer 910 are required to have (001) texture and perfect crystallinity. Thus, a first amorphous sublayer 906 is inserted into the stack to promote the growth of tunneling barrier sublayer 910. Whereas, well-known materials for the FCC AF pinning layer 716 (such as IrMn) require a (111) texture to grow, thus another amorphous sublayer 914 is inserted into the stack to promote the growth of the FCC AF pinning layer 716 by resetting the texture of the top pinned TMR device 900 from a <001> direction with (001) texture to a FCC<111> direction with (111) texture, as indicated by the arrows. The amorphous sublayer 906 serves the same purpose in the device 920 of FIG. 9B.

FIG. 9B is a schematic cross-sectional view of a bottom pinned TMR device 920, according to another embodiment. The bottom pinned TMR device 920 comprises a suitable substrate or shield (not shown), a pre-seed layer 502 disposed on the substrate, a seed layer 504 disposed on the pre-seed layer 502, a antiferromagnetic (AF) pinning layer 716 disposed on the seed layer 504, a FM1 layer 722 disposed on the antiferromagnetic pinning layer 716, a SAF spacer layer 710 comprising RuAl disposed on the FM1 layer 722, a FM2 layer 924 disposed on the SAF spacer layer 710, a tunneling barrier layer 910 disposed on the FM2 layer 924, a ferromagnetic free layer 925 disposed on the tunneling barrier layer 910, and the cap layer 512 disposed on the ferromagnetic free layer 925. The SAF spacer layer 710 has a (110) texture and <110> growth direction, and has a thickness of about 6.5 Å to about 10 Å.

The FM1 layer 722 comprises HCP/FCC sublayer 714 disposed on the FCC AF pinning layer 716, and the ferromagnetic BCC sublayer 712 disposed on the FM1 layer 722. The FM2 layer 924 comprises a ferromagnetic BCC FM2A layer 928 disposed on the SAF spacer layer 710, an amorphous sublayer 906 disposed on the BCC FM2A sublayer 928, and a ferromagnetic sublayer FM2B 930 disposed on the amorphous sublayer 906. The BCC FM2A sublayer 928 comprises CoFe or an alloy thereof.

As shown by the arrows, the seed layer 504 has a HCP (0001) texture and <0001> growth direction, the FCC AF pinning layer 716 and the HCP/FCC sublayer 714 have a (111) texture and <111> growth direction, and the BCC sublayer 712, the SAF spacer layer 710, and the BCC FM2A sublayer 928 have a (110) texture and <110> growth direction at least at the interface of SAF spacer layer. The amorphous layer 906 breaks the (110) texture and <110> growth direction such that FM2B 930, the tunneling barrier layer 910, and the free sublayer 904 have a (001) texture and <001> growth direction at the interface of the tunneling barrier layer.

Relative to conventional means, use of RuAl in SAF layers in a wide range of MR devices remedies many of the challenges in building such stacks. First, RuAl improves thermal stability which reduces the degradation of the AF coupling strength, and in turn, increases the reliability of such devices. Second, RuAl is grown effectively epitaxially on BCC (110) and FCC (111) textures, which in turn improves coupling field effects in such devices.

In one embodiment, a magnetoresistive (MR) device comprises a seed layer comprising Ru, a first ferromagnetic (FM1) layer disposed over the seed layer; a synthetic antiferromagnetic (SAF) spacer layer disposed on the FM1 layer, wherein the SAF spacer layer comprises RuAl, the SAF spacer layer has a (110) texture, and the SAF spacer layer having a total thickness in the range of about 6.5 Å to about 10 Å, and a second ferromagnetic (FM2) layer disposed on the SAF spacer layer.

The seed layer has a texture with a close-packed plane. The SAF spacer layer has a BCC based structure. The MR device further comprises a pre-seed layer disposed in contact with the seed layer, the pre-seed layer comprising an amorphous material selected from a group consisting of: a NiFeTa alloy, a CoFeTa alloy, a CoFeB alloy, a CoFeBTa alloy, and Ta, and a cap layer disposed over the FM2 layer. The MR device further comprises a FCC antiferromagnetic pinning layer disposed between the seed layer and the FM1 layer, wherein the FM1 layer is a multilayered structure comprising a BCC layer having a (110) texture. The MR device further comprises a FCC antiferromagnetic pinning layer disposed between the FM2 layer and the cap layer, wherein the FM2 layer is a multilayered structure, and wherein at least one BCC layer of the FM2 layer has a (110) texture. The FM2 layer further comprises a first BCC-based layer disposed in contact with the SAF spacer layer, and wherein the first BCC-based layer comprises a Heusler alloy. The FM1 layer comprises a second BCC-based layer disposed in contact with the SAF spacer layer. The MR device is one of a current in plane (CIP) giant magnetoresistive (GMR) device, a current perpendicular to plane (CPP) GMR device, or a tunneling magnetoresistive (TMR) device. A magnetic recording head comprising the MR device. A magnetic recording device comprising the magnetic recording head. A magneto-resistive random access memory (MRAM) comprising the MR device. A sensor comprises the MR device.

In another embodiment, a giant magnetoresistive (GMR) device comprises a seed layer grown with close-packed planes, a first ferromagnetic (FM1) layer disposed over the seed layer, the FM1 layer comprising a first BCC-based sublayer; a synthetic antiferromagnetic layer (SAF) layer disposed on the FM1 layer, the SAF spacer layer comprising RuAl; a second ferromagnetic (FM2) layer disposed on the SAF spacer layer, the FM2 layer comprising a second BCC-based sublayer; a cap layer disposed over the FM2 layer; a free layer disposed between the seed layer and the cap layer; and a FCC antiferromagnetic pinning layer disposed between the seed layer and the cap layer.

The GMR device further comprises a GMR spacer layer, wherein the free layer is disposed between the seed layer and the FM1 layer, wherein the GMR spacer layer is disposed on the free layer, and wherein the FCC antiferromagnetic pinning layer is disposed between the FM2 layer and the cap layer. The GMR device further comprises a GMR spacer layer disposed on the second BCC-based sublayer, wherein the free layer is disposed between the GMR spacer layer and the cap layer, and wherein the antiferromagnetic pinning layer is disposed between the seed layer and the FM1 layer. The SAF spacer layer has a (110) texture, and the SAF spacer layer a total thickness in the range of about 6.5 Å to about 10 Å. The SAF spacer layer is disposed in contact with the first BCC-based sublayer and the second BCC-based sublayer. The seed layer has a HCP structure, and wherein at least one of the first BCC-based sublayer or the second BCC-based sublayer comprises of a Heusler alloy or a half-Heusler alloy. A sensor comprises the GMR device.

In another embodiment, a tunneling magnetoresistive (TMR) device comprises a seed layer grown with close-packed planes; a first ferromagnetic (FM1) layer disposed over the seed layer; a synthetic antiferromagnetic layer (SAF) layer disposed on the FM1 layer, wherein: the SAF spacer layer comprises RuAl, and the SAF spacer layer has a (110) texture; a second ferromagnetic (FM2) layer disposed on the SAF spacer layer; a cap layer disposed over the FM2 layer; and a pinning layer disposed between the seed layer and the cap layer.

The TMR device further comprises a first free layer disposed on the seed layer; a second free layer disposed over the first free layer; and a tunneling barrier layer disposed between the second free layer and the FM1 layer, wherein the pinning layer is disposed between the FM2 layer and the cap layer. The FM1 layer further comprises: a first ferromagnetic sublayer disposed on the tunneling barrier layer; an amorphous ferromagnetic layer disposed on the first ferromagnetic sublayer; and a second ferromagnetic sublayer disposed on the amorphous ferromagnetic layer. The first ferromagnetic sublayer has a (001) texture and the second ferromagnetic sublayer has a (111) texture or a (110) texture.

The TMR device further comprises a free layer disposed between the cap layer and the FM2 layer, wherein the pinning layer is disposed between the seed layer and the FM1 layer. The FM2 layer further comprises: a first ferromagnetic sublayer disposed on the tunneling barrier layer; an amorphous ferromagnetic layer disposed on the first ferromagnetic sublayer; and a second ferromagnetic sublayer disposed on the amorphous ferromagnetic layer. The FM1 layer further comprises a first BCC-based layer disposed in contact with the SAF spacer layer, wherein the free layer and the second ferromagnetic sublayer have a (001) texture and the first BCC-based layer and the first ferromagnetic sublayer have a (110) texture. The TMR device further comprises a tunneling barrier layer disposed between the free layer and the second ferromagnetic sublayer. The pinning layer is a FCC antiferromagnetic pinning layer. A magnetic recording head comprising the TMR device. A magnetic recording device comprising the magnetic recording head. A magneto-resistive random access memory (MRAM) comprising the TMR device. A sensor comprises the TMR device.

While the foregoing is directed to embodiments of the present disclosure, other and further embodiments of the disclosure may be devised without departing from the basic scope thereof, and the scope thereof is determined by the claims that follow.

What is claimed is:

1. A magnetoresistive (MR) device, comprising:
a seed layer;
a first ferromagnetic (FM1) layer disposed over the seed layer;
a synthetic antiferromagnetic (SAF) spacer layer disposed on the FM1 layer, wherein:
the SAF spacer layer comprises RuAl,
the SAF spacer layer has a (110) texture, and
the SAF spacer layer having a total thickness in the range of about 6.5 Å to about 10 Å; and
a second ferromagnetic (FM2) layer disposed on the SAF spacer layer.

2. The MR device of claim 1, where in the seed layer has a texture with a close-packed plane, and wherein the SAF spacer layer has a BCC based structure.

3. The MR device of claim 1, further comprising:
a pre-seed layer disposed in contact with the seed layer, the pre-seed layer comprising an amorphous material selected from a group consisting of: a NiFeTa alloy, a CoFeTa alloy, a CoFeB alloy, a CoFeBTa alloy, and Ta; and a cap layer disposed over the FM2 layer.

4. The MR device of claim 1, further comprising a FCC antiferromagnetic pinning layer disposed between the seed layer and the FM1 layer, and wherein the FM1 layer is a multilayered structure comprising at least a BCC layer having a (110) texture.

5. The MR device of claim 1, further comprising a FCC antiferromagnetic pinning layer disposed between the FM2 layer and the cap layer, wherein the FM2 layer is a multilayered structure, and wherein at least one BCC layer of the FM2 layer has a (110) texture.

6. The MR device of claim 5, wherein the FM2 layer further comprises a first BCC-based layer disposed in contact with the SAF spacer layer, and wherein the first BCC-based layer comprises a Heusler alloy.

7. The MR device of claim 5, wherein the FM1 layer comprises a second BCC-based layer disposed in contact with the SAF spacer layer.

8. The MR device of claim 1, wherein the MR device is one of a current in plane (CIP) giant magnetoresistive (GMR) device, a current perpendicular to plane (CPP) GMR device, or a tunneling magnetoresistive (TMR) device.

9. A magnetic recording head comprising the MR device of claim 1.

10. A magnetic recording device comprising the magnetic recording head of claim 9.

11. A magneto-resistive random access memory (MRAM) comprising the MR device of claim 1.

12. A sensor comprising the MR device of claim 1.

13. A magnetic recording head comprising the MR device of claim 1.

14. A magnetic recording device comprising the magnetic recording head of claim 13.

15. A giant magnetoresistive (GMR) device, comprising: a seed layer grown with close-packed planes; a first ferromagnetic (FM1) layer disposed over the seed layer, the FM1 layer comprising a first BCC-based sublayer; a synthetic antiferromagnetic (SAF) spacer layer disposed on the FM1 layer, the SAF spacer layer comprising RuAl; a second ferromagnetic (FM2) layer disposed on the SAF spacer layer, the FM2 layer comprising a second BCC-based sublayer; a cap layer disposed over the FM2 layer; a free layer disposed between the seed layer and the cap layer; and a FCC antiferromagnetic pinning layer disposed between the seed layer and the cap layer.

16. The GMR device of claim 15, further comprising a GMR spacer layer, wherein the free layer is disposed between the seed layer and the FM1 layer, wherein the GMR spacer layer is disposed on the free layer, and wherein the FCC antiferromagnetic pinning layer is disposed between the FM2 layer and the cap layer.

17. The GMR device of claim 15, further comprising a GMR spacer layer disposed on the second BCC-based sublayer, wherein the free layer is disposed between the GMR spacer layer and the cap layer, and wherein the antiferromagnetic pinning layer is disposed between the seed layer and the FM1 layer.

18. The GMR device of claim 15, wherein the SAF spacer layer has a (110) texture, and wherein the SAF spacer layer a total thickness in the range of about 6.5 Å to about 10 Å.

19. The GMR device of claim 15, wherein the SAF spacer layer is disposed in contact with the first BCC-based sublayer and the second BCC-based sublayer.

20. The GMR device of claim 15, wherein the seed layer has a HCP structure, and wherein at least one of the first BCC-based sublayer or the second BCC-based sublayer comprises of a Heusler alloy or a half-Heusler alloy.

21. A sensor comprising the GMR device of claim 15.

22. A tunneling magnetoresistive (TMR) device, comprising:
a seed layer grown with close-packed planes
a first ferromagnetic (FM1) layer disposed over the seed layer;
a synthetic antiferromagnetic (SAF) spacer layer disposed on the FM1 layer, wherein:
the SAF spacer layer comprises RuAl, and
the SAF spacer layer has a (110) texture;
a second ferromagnetic (FM2) layer disposed on the SAF spacer layer;
a cap layer disposed over the FM2 layer; and
a pinning layer disposed between the seed layer and the cap layer.

23. The TMR device of claim 22, further comprising:
a first free layer disposed on the seed layer;
a second free layer disposed over the first free layer; and
a tunneling barrier layer disposed between the second free layer and the FM1 layer, wherein the pinning layer is disposed between the FM2 layer and the cap layer.

24. The TMR device of claim 23, wherein the FM1 layer further comprises:
a first ferromagnetic sublayer disposed on the tunneling barrier layer;
an amorphous ferromagnetic layer disposed on the first ferromagnetic sublayer; and
a second ferromagnetic sublayer disposed on the amorphous ferromagnetic layer.

25. The TMR device of claim 24, wherein the first ferromagnetic sublayer has a (001) texture and the second ferromagnetic sublayer has a (111) texture or a (110) texture.

26. The TMR device of claim 22, further comprising a free layer disposed between the cap layer and the FM2 layer, wherein the pinning layer is disposed between the seed layer and the FM1 layer.

27. The TMR device of claim 26, wherein the FM2 layer further comprises: a first ferromagnetic sublayer disposed on the SAF spacer layer; an amorphous ferromagnetic layer disposed on the first ferromagnetic sublayer; and a second ferromagnetic sublayer disposed on the amorphous ferromagnetic layer.

28. The TMR device of claim 27, wherein the FM1 layer further comprises a first BCC-based layer disposed in contact with the SAF spacer layer, wherein the free layer and the second ferromagnetic sublayer have a (001) texture and the first BCC-based layer and the first ferromagnetic sublayer have a (110) texture.

29. The TMR device of claim 28, further comprising a tunneling barrier layer disposed between the free layer and the second ferromagnetic sublayer.

30. The TMR device of claim 22, wherein the pinning layer is a FCC antiferromagnetic pinning layer.

31. A magneto-resistive random access memory (MRAM) comprising the TMR device of claim 22.

32. A sensor comprising the TMR device of claim 22.

* * * * *